United States Patent
Wu

(10) Patent No.: US 7,853,233 B2
(45) Date of Patent: Dec. 14, 2010

(54) ZERO IF DOWN CONVERTER WITH EVEN ORDER HARMONIC SUPPRESSION

(75) Inventor: Yue Wu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 941 days.

(21) Appl. No.: 11/180,957

(22) Filed: Jul. 13, 2005

(65) Prior Publication Data

US 2006/0057989 A1   Mar. 16, 2006

Related U.S. Application Data

(60) Provisional application No. 60/611,203, filed on Sep. 16, 2004.

(51) Int. Cl.
*H04B 1/26* (2006.01)
(52) U.S. Cl. .............. 455/323; 455/118; 455/66.1; 455/67.11; 455/78; 455/326; 455/333; 455/550.1; 330/254; 327/113; 327/356; 327/359; 327/551; 327/552
(58) Field of Classification Search .......... 455/222, 455/190.1, 278.1, 283–288, 295, 296, 310, 455/311, 312, 323, 302, 307, 313–314, 318, 455/114.2, 114.3, 63.1, 67.11, 67.13, 326, 455/20, 66.1, 78, 118, 333, 550.1; 327/113, 327/105, 359, 361, 389, 356, 551, 552; 330/254
See application file for complete search history.

(56) References Cited

U.S. PATENT DOCUMENTS

| | | | | |
|---|---|---|---|---|
| 4,636,663 A | * | 1/1987 | Jongepier et al. | 327/113 |
| 4,937,516 A | * | 6/1990 | Sempel | 323/315 |
| 5,507,036 A | * | 4/1996 | Vagher | 455/295 |
| 5,548,840 A | * | 8/1996 | Heck | 455/326 |
| 5,563,545 A | * | 10/1996 | Scheinberg | 327/389 |
| 5,625,307 A | * | 4/1997 | Scheinberg | 327/113 |
| 5,809,410 A | * | 9/1998 | Stuebing et al. | 455/333 |
| 5,825,231 A | * | 10/1998 | Chevallier et al. | 327/356 |
| 6,021,323 A | * | 2/2000 | Vagher | 455/324 |
| 6,029,059 A | * | 2/2000 | Bojer | 455/326 |
| 6,057,714 A | * | 5/2000 | Andrys et al. | 327/105 |
| 6,121,819 A | * | 9/2000 | Traylor | 327/359 |

(Continued)

OTHER PUBLICATIONS

Georgiadis, Apostolos and Point, Robert. "Performance Bounds and Mesaurmenets for AC-Coupled Direct-Conversion Transcievers under the Presence of 1/f Noise". IEEE Topical Conference on Wireless Communication Technology. 2003. pp. 29-32.

(Continued)

*Primary Examiner*—Edward Urban
*Assistant Examiner*—Junpeng Chen
(74) *Attorney, Agent, or Firm*—Jiayu Xu

(57) ABSTRACT

An embodiment is directed to a zero IF down converter circuit. The circuit comprises a voltage-to-current converter, a mixer, and a suppression circuit. The voltage-to-current converter converts an RF voltage signal to an RF current signal. The mixer changes the frequency of the current signal to a lower frequency current signal. The suppression circuit removes a lower frequency distortion component from the RF current signal before sending the RF current signal to the mixer.

31 Claims, 3 Drawing Sheets

U.S. PATENT DOCUMENTS

| | | | | |
|---|---|---|---|---|
| 6,140,849 | A * | 10/2000 | Trask | 327/113 |
| 6,292,047 | B1 * | 9/2001 | Traylor | 327/359 |
| 6,433,647 | B1 * | 8/2002 | Filoramo et al. | 332/103 |
| 6,472,925 | B1 * | 10/2002 | Komurasaki et al. | 327/361 |
| 6,566,949 | B1 * | 5/2003 | Park | 330/252 |
| 6,972,610 | B2 * | 12/2005 | Behzad | 327/359 |
| 6,999,745 | B2 * | 2/2006 | Leenaerts | 455/313 |
| 7,088,169 | B2 * | 8/2006 | Erba et al. | 327/359 |
| 7,099,646 | B1 * | 8/2006 | Jin et al. | 455/313 |
| 7,197,292 | B1 * | 3/2007 | Kouwenhoven et al. | 455/311 |
| 2003/0129958 | A1 * | 7/2003 | Behzad | 455/326 |
| 2003/0130006 | A1 * | 7/2003 | Reynolds | 455/550 |
| 2003/0216131 | A1 * | 11/2003 | Kovacevic et al. | 455/326 |
| 2004/0127187 | A1 * | 7/2004 | Peterson et al. | 455/323 |
| 2004/0147240 | A1 * | 7/2004 | Igarashi et al. | 455/302 |
| 2005/0208920 | A1 * | 9/2005 | Magnusen et al. | 455/296 |
| 2005/0266818 | A1 * | 12/2005 | Johnson et al. | 455/260 |
| 2007/0135074 | A1 * | 6/2007 | Igarashi et al. | 455/323 |

OTHER PUBLICATIONS

International Search Report and Written Opinion - PCT/US05/033134 - International Search Authority, European Patent Office - Jan. 13, 2006.

* cited by examiner

ZERO IF DOWN CONVERTER WITH EVEN ORDER HARMONIC SUPPRESSION

RELATED APPLICATION DATA

Priority is hereby claimed to U.S. Provisional Application No. 60/611,203 filed Sep. 16, 2004.

COPYRIGHT NOTICE

This patent document contains information subject to copyright protection. The copyright owner has no objection to the facsimile reproduction by anyone of the patent document or the patent, as it appears in the US Patent and Trademark Office files or records, but otherwise reserves all copyright rights whatsoever.

BACKGROUND

Aspects of the disclosure relate to the suppression of signal distortion in RF communication systems, for example, wireless handsets.

A RF receiver mixes an incoming signal thereby changing its carrier frequency. In a heterodyne receiver, the mixer changes the incoming signal's carrier frequency to an intermediate frequency. In a direct conversion RF receiver, otherwise called a zero IF RF receiver, the mixer changes the incoming signal's carrier frequency to a frequency of zero.

A given mixer may generate distortion components, including a distortion referred to as the "second order IM2 distortion." This distortion is at a relatively low frequency, and thus generally does not have a large impact on the signal-to-noise ratio of a mixed signal in a heterodyne receiver. In contrast, in the zero IF RF receiver, the second order IM2 distortion more closely coincides with the down converted (mixed) signal. The IM2 distortion is at a low frequency, and the mixed signal with a carrier frequency of zero is also at a low frequency. Therefore, with the zero IF RF receiver, the second order IM2 distortion has much more of an impact on the mixed signal's signal-to-noise ratio.

BRIEF SUMMARY

An embodiment is directed to a zero IF down converter circuit. The circuit comprises a voltage-to-current converter, a mixer, and a suppression circuit. The voltage-to-current converter converts an RF voltage signal to an RF current signal. The mixer changes a frequency of the current signal to a lower frequency current signal. The suppression circuit removes a lower frequency distortion component from the RF current signal before sending the RF current signal to the mixer.

BRIEF DESCRIPTION OF THE DRAWINGS

Embodiments will be described with reference to the following drawing figures, in which like numerals represent like items throughout the figures, and in which.

DETAILED DESCRIPTION

Figure 1:
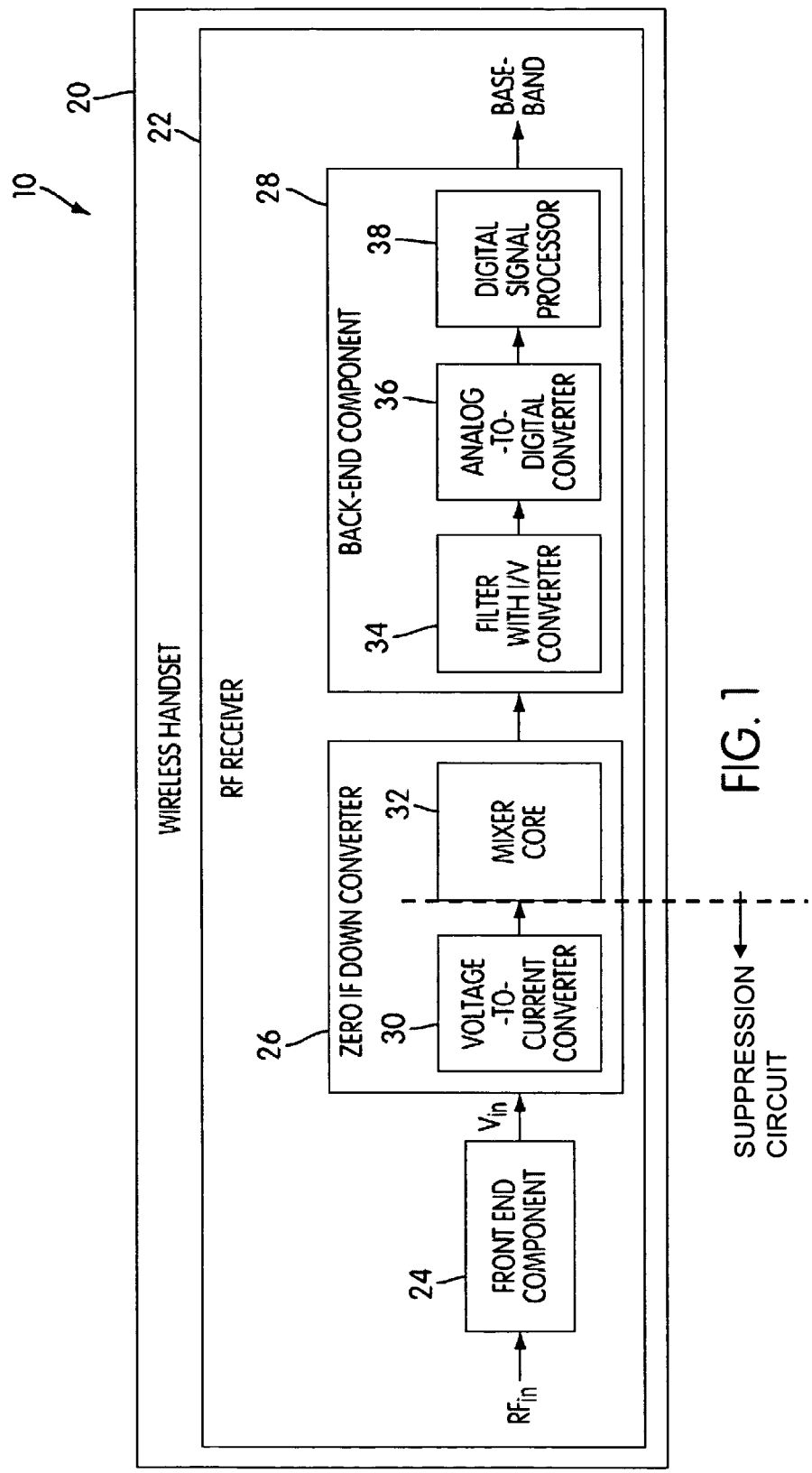
FIG. 1. is a block diagram of a RF communication system comprising a integrated circuit with a zero IF down converter including a suppression circuit.

FIG. 1 is a block diagram of an RF communication system, generally indicated at 10. A wireless handset 20 comprises a RF receiver 22 with a zero IF down-converter 26 that converts a received RF power at one frequency range to another frequency range for subsequent signal processing in a back-end component 28.

The RF receiver 22 and its components are illustrated schematically; other components (not shown) may be included. In general, front-end component 24 processes a voltage at a pre-selected RF frequency, and inputs the voltage to a zero IF down-converter 26. Front-end component 24 may comprise an amplifier, a filter, and/or an oscillator (which for simplicity, are not specifically shown in FIG. 1). The voltage signal from the front-end component 24 is typically at a particular transmission frequency when it enters the zero IF down-converter 26. Zero IF down-converter 26 converts the received RF voltage signal at that particular transmission frequency to a current signal at a lower frequency and sends the current signal to back end component 28.

The zero IF down-converter may be followed by or coupled to any number of components; a filter 34, an analog-to-digital converter 36, and a digital signal processor (DSP) 38 are illustrated in FIG. 1, but these are merely examples of the types of components that might be used.

Zero IF down-converter 26 may comprise a voltage-to-current converter 30 and a mixer core 32. In general terms, Zero IF down-converter 26 is a voltage device in and a current device out. Voltage-to-current converter 30 converts the input voltage signal into an output current signal, and sends the current signal to the mixer core 32. Mixer core 32 mixes the current signal from voltage-to-current converter 30 with an oscillator signal.

A goal of an RF receiver of a wireless handset (e.g., a mobile phone) is to provide a clear signal to the wireless handset. As mentioned above, elements of a voltage-to-current converter 30 of a zero IF down-converter 26 may produce an even-order non-linearity that generates a low frequency inter-modulation component (referred to above as a "second order IM2 distortion"). The inter-modulation component overlaps with the desired output signal of the voltage-to-current converter 30, which is passed through the mixer core 32. Mismatching of the signals in the mixer core 32 causes the inter-modulation component to interfere with the mixer core's 32 output signal; in effect the inter-modulation component cannot be distinguished from the desired signal. As a result, the inter-modulation component causes a distortion in the mixer's output signal.

To address the above-identified phenomena, voltage-to-current converter 30 of FIG. 1 comprises a suppression circuit, an example implementation of which is described in more detail below, to suppress the low frequency distortion component generated in the voltage-to-current converter 30 before the RF current signal reaches the mixer core 32.

Figure 2:
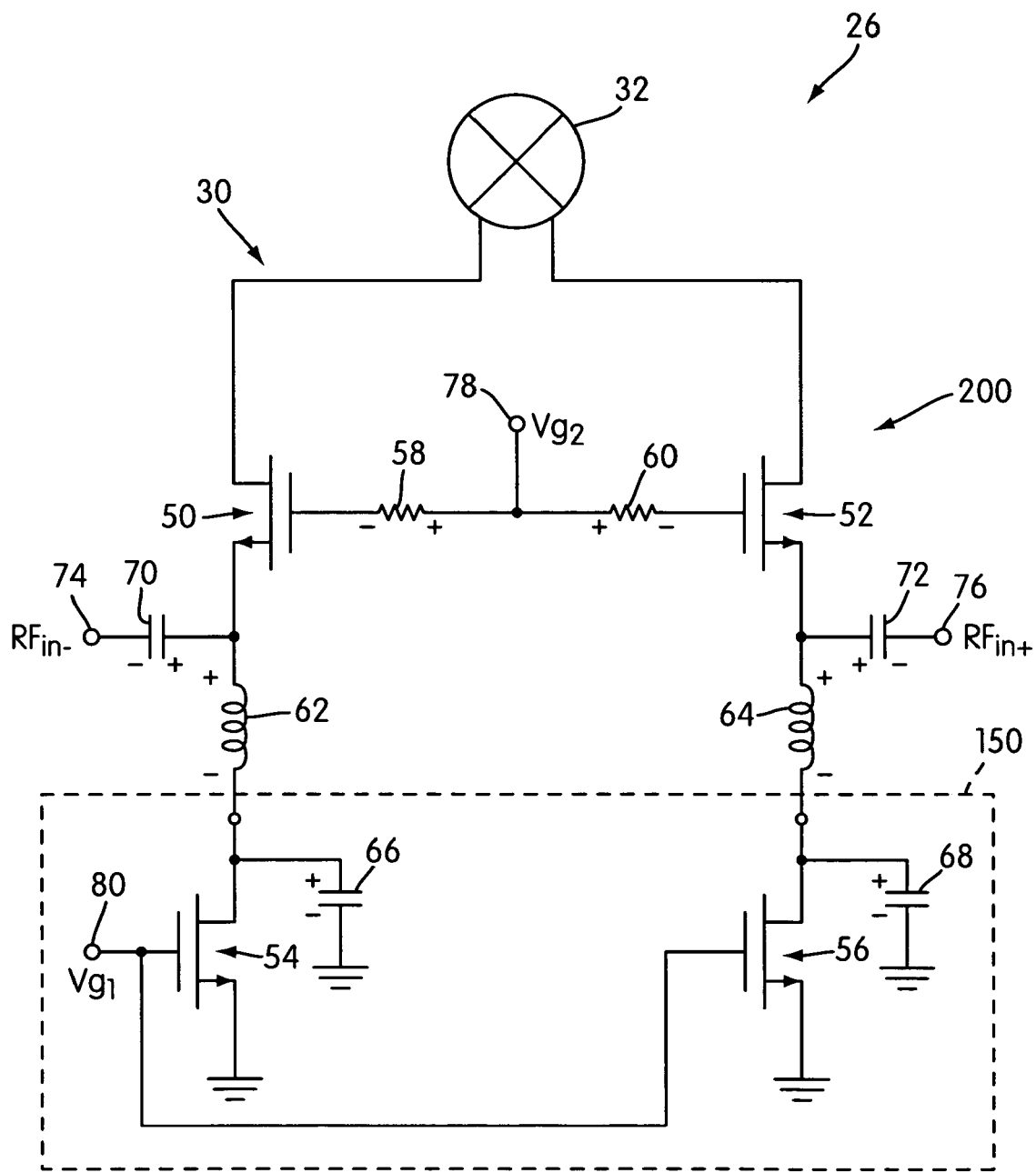
FIG. 2 is a schematic representation of a mixer comprising a voltage-to-current converter with a suppression circuit.

FIG. 2 shows one example embodiment of a zero IF down-converter 26 that includes a suppression circuit to suppress the IM2 component prior to processing the signal in a mixer core, thus preventing the distortion in the mixer's output signal. The illustrated zero IF down-converter 26 comprises an early stage (e.g., a first stage) that includes a voltage-to-current converter 30 with a suppression circuit 150 and a later stage that includes a mixer core 32.

Voltage-to-current converter 30 comprises a voltage-to-current circuit 200 and a suppression circuit 150. In this embodiment, the voltage-to-current circuit 200 and the suppression circuit 150 are implemented with the same type of transistor devices. Voltage-to-current circuit 200 comprises a pair of n-channel MOSFET transistors 50, 52, a pair of inductors 62, 64, a pair of resistors 58, 60, and a pair of capacitors 70, 72. RFin nodes 76, 74 are the voltage input terminals of the voltage to current converter. The voltage-to-current circuit 200 converts the RF input voltage signal 76, 74 into a current for subsequent signal processing in the mixer core 32. Vg1 and Vg2 are DC bias voltages.

The suppression circuit 150 suppresses the low frequency inter-modulation component generated by an even-order non-linearity produced by transistor 50 and transistor 52 of the voltage-to-current circuit 200. As shown in FIG. 2, suppression circuit element 150 includes a pair of n-channel MOSFET transistors 54, 56 and a pair of AC bypass capacitors 66, 68. Transistor 54 and transistor 56 provide an increased low frequency resistance to the voltage-to-current circuit 200. Capacitor 66 and capacitor 68 are AC bypass capacitors that ground the RF frequency components of inductor 62 and inductor 64. Thus, with this arrangement, the noise from transistor 54 and transistor 56 are shunted to ground. The RF input is coupled to the voltage-to-current circuit 200 through capacitor 70 and capacitor 72. In conjunction, these components generate high impedance at the inter-modulation frequency to the source terminal of transistor 50 and to the source terminal of transistor 52. As a result of generating high impedance at a low frequency to the source terminal of transistor 50 and to the source terminal of transistor 52, the low frequency inter-modulation component generated by voltage-to-current circuit 200 is suppressed.

Figure 3:
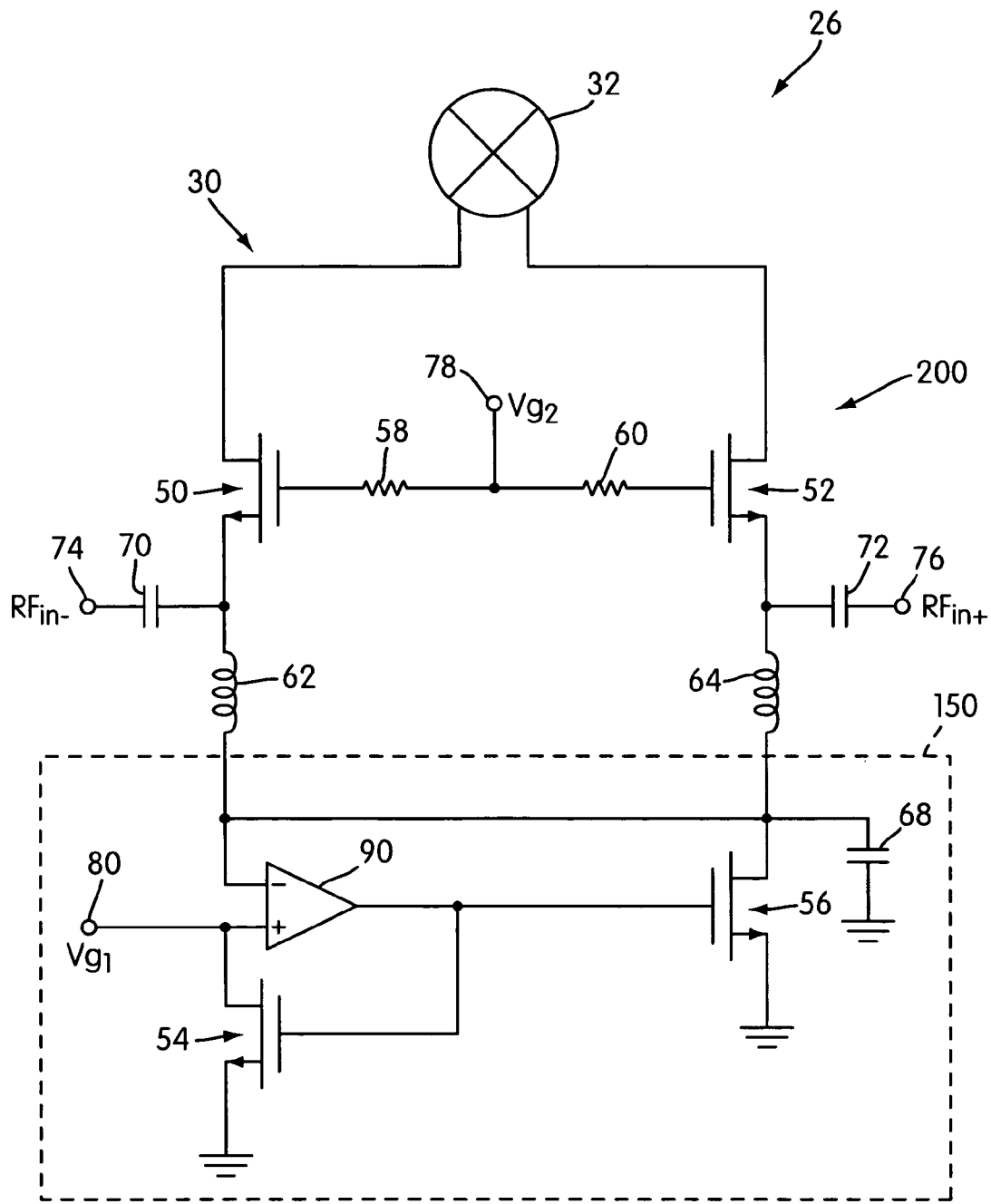
FIG. 3. is a schematic representation of a mixer comprising a voltage-to-current converter with suppression circuit including an operational amplifier.

Another example embodiment is shown in FIG. 3. FIG. 3 is a schematic representation of a zero IF down-converter 26 comprising an early stage (e.g. first stage) that includes a voltage-to-current converter 30 and a later stage (e.g. second stage) that includes a mixer core 32. In this embodiment, voltage-to-current converter 30 comprises a voltage-to-current circuit 200 and a suppression circuit 150. The voltage-to-current circuit 200 and the suppression circuit 150 may, e.g., be implemented with the same type of transistor devices.

The voltage-to-current circuit 200 converts the RF input voltage signal 76, 74 into a current for subsequent signal processing in the mixer core 32. The components 50, 52, 62, 64, 58, 60, 70, 72 of voltage-to-current circuit 200 may be the same or similar to the components illustrated in FIG. 2 and described above.

The suppression circuit 150 is added to voltage-to-current circuit 200 for suppression of the inter-modulation component generated by an even-order non-linearity (e.g., a second order harmonic) produced by transistor 50 and transistor 52 of the voltage-to-current circuit 200. As shown in this embodiment, suppression circuit 150 includes a pair of n-channel MOSFET transistors 54, 56, a capacitor 68, and an operational amplifier 90. Transistor 54 and transistor 56 provide a low frequency resistance to the voltage-to-current circuit 200. Capacitor 68 is an AC bypass capacitor that grounds the RF frequency components of inductor 64. Thus with this arrangement, the noise from transistor 54 and from transistor 56 are shunted to ground. The operational amplifier 90 increases the low frequency impedance of transistor 54 and transistor 56 by an amount equal to its gain. The RF input is coupled to the voltage-to-current circuit 200 through capacitor 70 and capacitor 72. In conjunction, these components generate high impedance at the inter-modulation frequency to the source terminal of transistor 50 and to the source terminal of transistor 52. As a result of generating high impedance at a low frequency to the source terminal of transistor 50 and to the source terminal of transistor 52, the low frequency inter-modulation component generated by voltage-to-current circuit 200 is suppressed.

While certain illustrated embodiments have been described, the words which have been used are words of description rather than words of limitation. Changes may be made, e.g., within the purview of the appended claims.

What is claimed is:

1. A zero IF down converter circuit, comprising:
  a voltage-to-current converter to convert an RF voltage signal to an RF current signal;
  a mixer to change a frequency of the current signal to a lower frequency current signal; and
  a suppression circuit to remove a lower frequency distortion component from the RF current signal before sending the RF current signal to the mixer;
  wherein:
  the voltage-to-current converter comprises a first field effect transistor (FET) comprising a gate, a drain, and a source, a first inductor comprising a first end coupled to the source of the first FET and a second end, and a first input for receiving the RF voltage signal, the first input being coupled to the source of the first FET; and
  the suppression circuit comprises a first bypass capacitor coupled between the second end of the first inductor and a reference node, a first suppression circuit FET coupled between the second end of the first inductor and the reference node, and a second suppression circuit FET, wherein a gate of the first suppression circuit FET is coupled to a gate of the second suppression circuit FET.

2. The zero IF down converter of claim 1, wherein:
  the voltage-to-current converter further comprises a second FET comprising a gate, a drain, and a source, a second inductor comprising a first end coupled to the source of the second FET and a second end, and a second input for receiving the RF voltage signal, the second input being coupled to the source of the second FET; and
  the suppression circuit further comprises a second bypass capacitor coupled between the second end of the second inductor and the reference node.

3. The zero IF converter of claim 2, wherein the reference node is ground.

4. The zero IF down converter of claim 3, wherein the first and second FETs are n-channel MOSFET transistors.

5. The zero IF down converter of claim 2, wherein the second suppression circuit FET is coupled between the second end of the second inductor and the reference node.

6. The zero IF down converter of claim 2, wherein the first FET and the second FET are configured for differential operation.

7. The zero IF down converter of claim 1, wherein the first input is coupled to the source of the first FET through a first input capacitor.

8. The zero IF down converter of claim 1, wherein the suppression circuit further comprises an operational amplifier.

9. A wireless device comprising:
  a front end component;
  a back end component;
  a voltage-to-current converter to convert an RF voltage signal to an RF current signal;
  a mixer to change a frequency of the current signal to a lower frequency current signal; and
  a suppression circuit to remove a lower frequency distortion component from the RF current signal before sending the RF current signal to the mixer;

wherein:
the voltage-to-current converter comprises a first field effect transistor (FET) comprising a gate, a drain, and a source, the first FET being connected in a common gate configuration, a first inductor comprising a first end coupled to the source of the first FET and a second end, and a first input for receiving the RF voltage signal, the first input being coupled to the source of the first FET; and the suppression circuit comprises a first bypass capacitor coupled between the second end of the first inductor and a reference node, a first suppression circuit FET coupled between the second end of the first inductor and the reference node, and a second suppression circuit FET, wherein a gate of the first suppression circuit FET is coupled to a gate of the second suppression circuit FET.

10. The wireless device according to claim 9, wherein:
the voltage-to-current converter further comprises a second FET comprising a gate, a drain, and a source, the second FET being connected in a common gate configuration, a second inductor comprising a first end coupled to the source of the second FET and a second end, and a second input for receiving the RF voltage signal, the second input being coupled to the source of the second FET; and the suppression circuit further comprises a second bypass capacitor coupled between the second end of the second inductor and the reference node.

11. The wireless device according to claim 10, wherein the reference node is ground.

12. The wireless device according to claim 11, wherein the first and second FETs are n-channel MOSFET transistors.

13. The wireless device according to claim 10, wherein the second suppression circuit FET is coupled between the second end of the second inductor and the reference node.

14. The wireless device according to claim 10, wherein the first FET and the second FET are configured for differential operation.

15. The wireless device according to claim 9, wherein the first input is coupled to the source of the first FET through a first input capacitor.

16. The wireless device according to claim 9, wherein the suppression circuit further comprises an operational amplifier.

17. A method to perform zero IF down conversion, the method comprising:
converting an RF voltage signal to an RF current signal;
changing the RF current signal to a lower frequency current signal; and
suppressing a lower frequency distortion component in the RF current signal before changing the RF current signal to the lower frequency current signal;
wherein:
the step of converting comprises using a first converter comprising a first field effect transistor (FET) comprising a gate, a drain, and a source, a first inductor comprising a first end coupled to the source of the first FET and a second end, and a first input for receiving the RF voltage signal, the first input being coupled to the source of the first FET; and
the step of suppressing comprises using a first bypass capacitor coupled between the second end of the first inductor and a reference node, using a first suppression circuit FET coupled between the second end of the first inductor and the reference node, and using a second suppression circuit FET, wherein a gate of the first suppression circuit FET is coupled to a gate of the second suppression circuit FET.

18. The method according to claim 17, wherein:
the step of converting further comprises using a second converter comprising a second FET comprising a gate, a drain, and a source, a second inductor comprising a first end coupled to the source of the second FET and a second end, and a second input for receiving the RF voltage signal, the second input being coupled to the source of the second FET; and
the step of suppressing further comprises using a second bypass capacitor coupled between the second end of the second inductor and the reference node.

19. The method according to claim 18, wherein the reference node is ground.

20. The method according to claim 19, wherein the steps of converting and suppressing are each performed with n-channel MOSFET transistors.

21. The method according to claim 18, wherein the second suppression circuit FET is coupled between the second end of the second inductor and the reference node.

22. The method according to claim 18, wherein the RF voltage signal and the RF current signal are differential signals, and the first and second FETs are configured for differential operation.

23. The method according to claim 17, further comprising connecting the RF voltage signal to the first converter through an input capacitor.

24. The method according to claim 17, wherein the step of suppressing further comprises using an operational amplifier.

25. An apparatus comprising:
means for converting an RF voltage signal to an RF current signal;
means for changing a frequency of the RF current signal to a lower frequency current signal; and
means for removing a lower frequency distortion component from the RF current signal before sending the RF current signal to the means for changing the frequency of the RF current signal, wherein the means for removing comprises a first suppression circuit FET and a second suppression circuit FET, wherein a gate of the first suppression circuit FET is coupled to a gate of the second suppression circuit FET;
wherein the means for converting the RF voltage signal comprises an FET common gate amplifier and an inductor, and wherein the inductor is connected between the common gate amplifier and the means for removing the lower frequency distortion component.

26. The apparatus according to claim 25, wherein the FET common gate amplifier comprises a differential pair of field effect transistors.

27. The apparatus according to claim 26, wherein the means for removing the lower frequency component further comprises at least one capacitor, and wherein the at least one capacitor and the first suppression circuit FET are connected in parallel between the inductor and ground.

28. The apparatus according to claim 27, wherein the means for removing further comprises an operational amplifier.

29. Non-transitory machine-readable media encoded with data, the data being readable by a computer to cause:
converting an RF voltage signal to an RF current signal;
changing the RF current signal to a lower frequency current signal; and removing a lower frequency distortion component from the RF current signal before changing the RF current signal to a lower frequency current signal;

wherein:

the step of converting comprises using a first converter comprising a first field effect transistor (FET) comprising a gate, a drain, and a source, a first inductor comprising a first end coupled to the source of the first FET and a second end, and a first input for receiving the RF voltage signal, the first input being coupled to the source of the first FET; and the step of removing comprises using a first bypass capacitor coupled between the second end of the first inductor and a reference node, using a first suppression circuit FET coupled between the second end of the first inductor and the reference node, and using a second suppression circuit FET, wherein a gate of the first suppression circuit FET is coupled to a gate of the second suppression circuit FET.

30. The non-transitory machine-readable media according to claim 29, wherein the data is readable by a computer to cause:

the step of converting to further comprise using a second converter comprising a second FET comprising a gate, a drain, and a source, a second inductor comprising a first end coupled to the source of the second FET and a second end, and a second input for receiving the RF voltage signal, the second input being coupled to the source of the second FET; and the step of suppressing to further comprises using a second bypass capacitor coupled between the second end of the second inductor and the reference node.

31. The non-transitory machine-readable media according to claim 30, wherein the data is readable by a computer to cause the reference node to be ground.

* * * * *